United States Patent [19]

Wada et al.

[11] Patent Number: 5,323,342
[45] Date of Patent: Jun. 21, 1994

[54] MOS MEMORY DEVICE

[75] Inventors: Toshio Wada; Shoichi Iwasa, both of Sagamihara, Japan

[73] Assignee: Nippon Steel Corporation, Tokyo, Japan

[21] Appl. No.: 967,710

[22] Filed: Oct. 28, 1992

[30] Foreign Application Priority Data

Oct. 31, 1991 [JP] Japan .................. 3-313461

[51] Int. Cl.$^5$ ............................................ G11C 17/00
[52] U.S. Cl. ..................... 365/104; 365/203
[58] Field of Search ............... 365/94, 104, 207, 208, 365/194, 195, 189.01, 203, 204

[56] References Cited

U.S. PATENT DOCUMENTS 4,388,705 6/1983 Sheppard ............... 365/104 X
4,805,143 2/1989 Matsumoto et al. ............... 365/104

FOREIGN PATENT DOCUMENTS 62-195786 8/1987 Japan .

OTHER PUBLICATIONS

"Design of CMOS Ultra LSI" Baifukan, pp. 168-169 Apr. 25, 1989.

Primary Examiner—Joseph A. Popek
Attorney, Agent, or Firm—Pollock, Vande Sande & Priddy

[57] ABSTRACT

A semiconductor memory device to be used as a mask ROM having: a MOS transistor array having MOS transistors disposed in a matrix of rows and columns, the drain-source circuits of the MOS transistors in each row being serially connected; a row selecting decoder for selecting one of the rows; first and second column lines alternately disposed in the row direction, each first column line being connected to one end of the drain-source circuit of each of the MOS transistors disposed in one column, and each second column line being connected to the other end of the drain-source circuit of each of the MOS transistors disposed in the one column; a data reading circuit for reading data stored in the MOS transistor array; a first switching circuit for selectively connecting one of the first column lines to the data reading circuit; a second switching circuit for selectively connecting one of the second column lines to a ground potential; and a column selecting circuit for selecting one of the columns of the MOS transistors, the column selecting circuit including a plurality of column select lines provided to the MOS transistor columns, respectively, wherein when one of the column select lines is activated, the first and second switching circuits connected to the first and second column lines connected to the MOS transistors in the corresponding column are made conductive at the same time.

4 Claims, 4 Drawing Sheets

F I G. 1
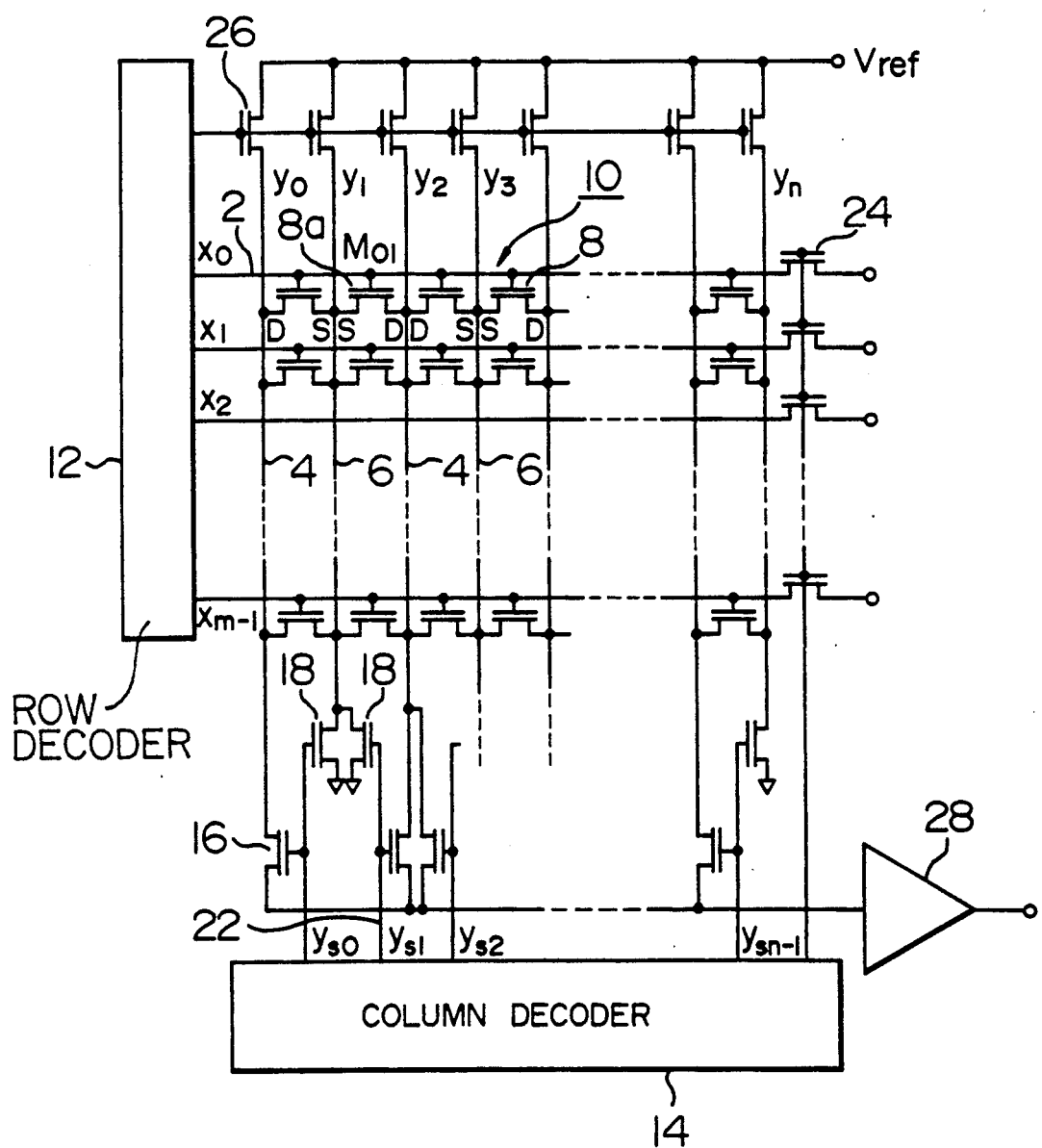

MOS MEMORY DEVICE

CROSS-REFERENCE TO THE RELATED APPLICATION

This application is relating to co-pending U.S. patent application Ser. No. 07/967,709 corresponding to Japanese Patent Application No. 3-313459 filed on Oct. 31, 1991.

FIELD OF THE INVENTION

The present invention relates to a metal oxide semiconductor (MOS) memory device, and more particularly to the circuit structure of a MOS memory device used as a mask ROM in which programs are written during its manufacturing process.

BACKGROUND OF THE INVENTION

As described in "Design of CMOS Ultra LSI" by Takuo SUGANO, Baifukan, pp. 168 to 169, conventional methods of writing programs in a mask ROM include a diffusion layer programming method, an ion implantation programming method, a contact hole programming method, and the like. The mask ROM is divided into a NAND type and an OR type depending upon the layout of memory cells. Generally, a NAND type ROM can reduce the size of memory cell array more than a NOR type ROM, and the diffusion layer programming method and ion implantation programming method for a mask ROM can reduce the size of memory cell array more than the contact hole programming method.

FIG. 3 is a circuit diagram of a conventional NAND type ROM using the ion implantation programming method. In this circuit of the NAND type ROM, the direction of the channel of a MOS transistor 72 constituting a memory cell is aligned in the direction of a bit line 54. In an ordinary case, the threshold voltage (hereinafter abbreviated as Vth) of each MOS transistor 72 is set to a value corresponding to the enhancement type, and only the selected MOS transistors 72 are changed to have a value of Vth corresponding to the depletion type, to thereby write a desired program. In FIG. 3, reference numeral 62 represents a row decoder, and reference numeral 64 represents a column decoder. Transistors 42 are turned on during the memory read standby state to ground and discharge all word lines. Mask ROMs of this kind are disclosed, for example, in JP-A-62-195,786.

In reading data from a memory cell, first all the word lines 52 are set to an "H" level. Thereafter, the selected word line 52 is set to an "L" level and the selected bit line 54 is set to the "H" level. If Vth of the selected memory cell corresponds to the depletion type, a current flowing through the selected bit line 54 continues to flow even if the word line 52 is set to the "L" level. On the other hand, if the Vth corresponds to the enhancement type, a current flowing through the selected bit line 54 is cut off. In this manner, data in the memory cell can be read.

FIG. 4 is a circuit diagram of a conventional NOR type ROM using the ion implantation programming method. In this circuit of the NOR type ROM, a bit line 56, a MOS transistor 72, and a bit line 58 are repetitively disposed in this order in the row direction. The drain and source of each of the MOS transistor 72 disposed in the column direction are connected to the bit lines 56 and 58. The gates of the MOS transistors 72 disposed in the row direction are connected in common to a word line 52. All the bit lines 56 are electrically grounded, and the bit lines 58 are used for selecting a desired column.

In this circuit, Vth of each MOS transistor 72 is set to a value corresponding to the enhancement type allowing the MOS transistor to turn on when the word line 52 takes the "H" level. Only the selected memory cells are changed to have a value of Vth not allowing the memory cells to turn on when the word line 52 takes the "H" level. In this manner, a desired program is written in the mask ROM. In reading data from a memory cell, first all the word lines 52 are set to the "L" level or made open and all the bit lines are also made open. Thereafter, only the selected word line 52 is set to the "H" level and a pair of bit lines 56 and 58 connected to the memory cell are selected. If Vth of the selected memory cell has a value not allowing the memory cell to turn on when the word line 52 takes the "H" level, then the bit line 56 is grounded and the other bit line 58 is connected via a select transistor 74 to an operational amplifier 66. Data is read by checking the electrical conductivity of each selected memory cell as described above.

In the case of a NAND type ROM, as the number of memory cells disposed in a column direction increases, the total on-resistance of the cell transistors becomes larger, resulting in a smaller current flowing through the bit line and a slower access speed. For this reason, the number of memory cells in a column direction is limited.

In the case of a NOR type ROM, although it is free from the above disadvantages of the NAND type ROM, two bit lines are required for the memory cells in each column so that the structure of a decoder system becomes complicated. Therefore, the area of a memory cell array of a NOR type ROM becomes larger than that of a NAND type ROM.

SUMMARY OF THE INVENTION

It is an object of the present invention to provide a NOR type MOS memory device capable of simplifying the structure of a decoder and providing a high integration.

In order to achieve the above object, a MOS memory device according to the present invention comprises: a memory cell array having memory cells disposed at rows and columns of a matrix shape, each memory cell being formed of a MOS transistor having a gate, a drain and a source, and MOS transistors is each row being serially connected with source-drain circuits of the MOS transistors whose directions are alternately reversed; a plurality of row lines each connected to gates of the MOS transistors disposed in one row; a row decoder connected to the row lines for selecting one of the row lines; first and second column lines alternately disposed in the row direction, each first column line being connected to the drains of the MOS transistors disposed in one column and to the drains of the MOS transistors disposed in another column adjacent to the one column in the row direction, and each second column line being connected to the sources of the MOS transistors disposed in one column and to the sources of the MOS transistors disposed in another column adjacent to the one column in the row direction; data reading mean for reading data stored in the memory cell array; first switching means connected between each first column line and the data reading means; second switching means connected between each second column line and the a ground potential; and column selecting means for selecting one of columns for the MOS transistors, the column selecting means including a plurality of column select lines each provided for each MOS transistor column, and a column decoder connected to the plurality of column select lines for selectively activating one of the plurality of column select lines, wherein when each column select line is activated, the first and second switching means connected to the first and second column lines connected to the MOS transistors disposed in the corresponding column are made conductive at the same time.

With the above-described structure of a NOR type semiconductor memory device of the present invention, the MOS transistors disposed in two columns adjacent to each other in a row direction are connected to a common column line (first or second column line) disposed between the two columns. Therefore, the number of column lines is reduced to a half of that of a conventional NOR type semiconductor memory device so that the area of a memory cell array is reduced more than a conventional memory cell array. Furthermore, a single column select line is provided for each column of the MOS transistors, and the first and second switching means are made conductive at the same time by activating the select column line to select the MOS transistors connected to that column. Therefore, the structure of the column decode can be simplified to the same extent as a conventional NAND type memory device.

BRIEF DESCRIPTION OF THE DRAWINGS

FIG. 1 is a circuit diagram of an embodiment of a NOR type semiconductor memory device used as a mask ROM according to the present invention;

DESCRIPTION OF THE PREFERRED EMBODIMENTS

Figure 2A:
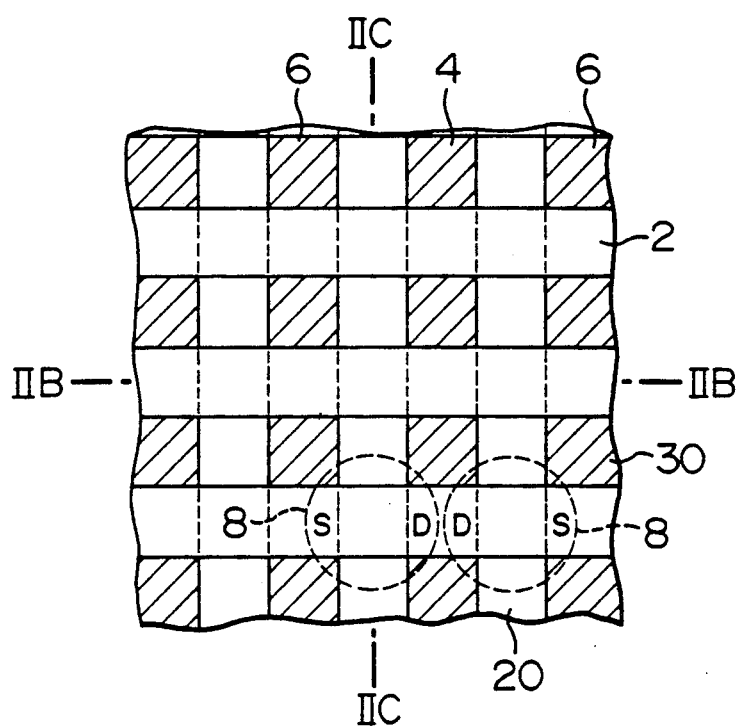
FIGS. 2A, 2B, and 2C are a plan view and cross sectional views showing the structure of a semiconductor memory device.

An embodiment of the present invention will be described with reference to FIGS. 1 and 2A to 2C. FIG. 1 is a circuit diagram of an embodiment of a NOR type semiconductor memory device to be used as a mask ROM according to the present invention.

As shown in FIG. 1, this memory device has a number of word lines $(x_0, x_1, x_2, \ldots, x_{m-1})$ 2, a number of bit lines $(y_0, y_1, y_2, \ldots, y_n)$ 4 and 6, a memory cell array 10 having a number of memory cells disposed in a matrix of m rows and n columns, each memory cell being formed by a MOS transistor, X and Y decoders 12 and 14 for selecting one of the memory cells, first and second select transistors 16 and 18, Y select lines $(y_{s0}, y_{s1}, y_{s2}, \ldots, y_{sn-1})$ 22, X and Y inhibit transistors 24 and 28, and a sense amplifier 28.

Each memory cell is constituted by a single MOS transistor 8. In the memory cell array 10, a first bit line 4, a MOS transistor 8, a second bit line 6, and a MOS transistor 8 are repetitively disposed in this order in the row direction, and a word line 2 and a MOS transistor 8 are repetitively disposed in this order in the column direction. The sources of the MOS transistors 8, which are disposed side by side along the row direction with their sources being connected to each other are connected to the second bit lines $(y_1, y_3, y_5, \ldots)$ 6, and the drains of the MOS transistors, which are disposed side by side along the row direction with their drains being connected to each other, are connected to the first bit lines $(y_0, y_2, y_4, \ldots)$ 4. The gates of the MOS transistors 8 disposed along the row direction are connected in common to each word line 2.

Each of the first bit lines 4 is connected to a data sense line 20 via the first select transistor 16. Each of the second bit lines 6 is grounded via the second select transistor 18. The gates of the first and second select transistors 16 and 18 connected to associated first and second bit lines are connected in common to one of Y select lines 22. The Y select lines 22 are connected to the Y decoder 14. Therefore, when the Y decoder 14 selects one of the Y select lines 22, a pair of associated first and second bit lines 4 and 6 can be selected at the same time.

Each word line 2 is serially connected to the X inhibit transistor 24, so that when all the word lines 2 are in a non-select state or standby state, they can be discharged. Similarly, each bit line 4 or 6 is serially connected to the Y inhibit transistor 26. Therefore, during the standby state, all the Y inhibit transistors 26 are turned on to set all the bit lines 4 and 6 to a reference potential Vref.

In this memory device, the threshold voltage (hereinafter abbreviated as Vth) of each MOS transistor 8 is first set to a value corresponding to the enhancement type allowing the MOS transistor to turn on when the word line 2 takes an "H" level. Therefore, the Vth of only the selected memory cells is changed to a value not allowing the selected memory cells to turn on when the word line 2 takes the "H" level. In this manner, a desired program is written in the mask ROM.

Next, the method of reading a program from the mask ROM of this embodiment will be described. Reading data from a memory cell $M_{01}$ shown in FIG. 1 will be explained by way of example. First the Y inhibit transistors 26 are turned on to set all the bit lines 4 and 6 to the reference potential Vref, and the X inhibit transistors 24 are turned off. Then, the word line $x_0$ is selected to set the gate of the MOS transistor 8a connected to the word line $x_0$ to a high level Vcc. When the Y select line $y_{s1}$ is selected, the first select transistor 16a and second select transistor 18a connected to the Y select line $y_{s1}$ become conductive. Therefore, the first bit line $y_2$ is grounded and the second bit line $y_1$ is connected to an input of the sense amplifier 28 via the data sense line 20. If the Vth of the memory cell $M_{01}$ is lower than Vcc, the MOS transistor 8a becomes conductive so that the first bit line takes a ground potential. To the contrary, if the Vth of the memory cell $M_{01}$ is not lower than Vcc, the MOS transistor 8a will not become conductive so that the preset Vref is applied to the sense amplifier 28. In this manner, each memory cell is accessed and its data is read.

Figure 2C:
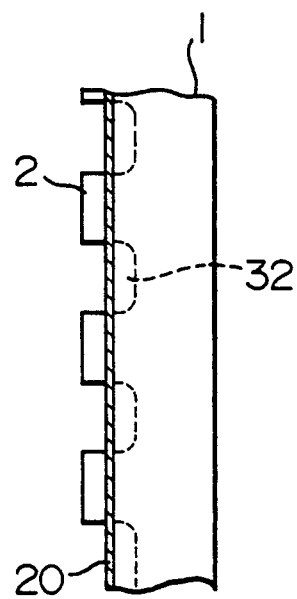
Figure 2B:
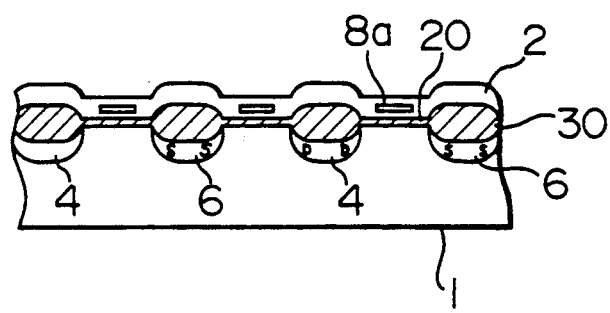
Figure 3:
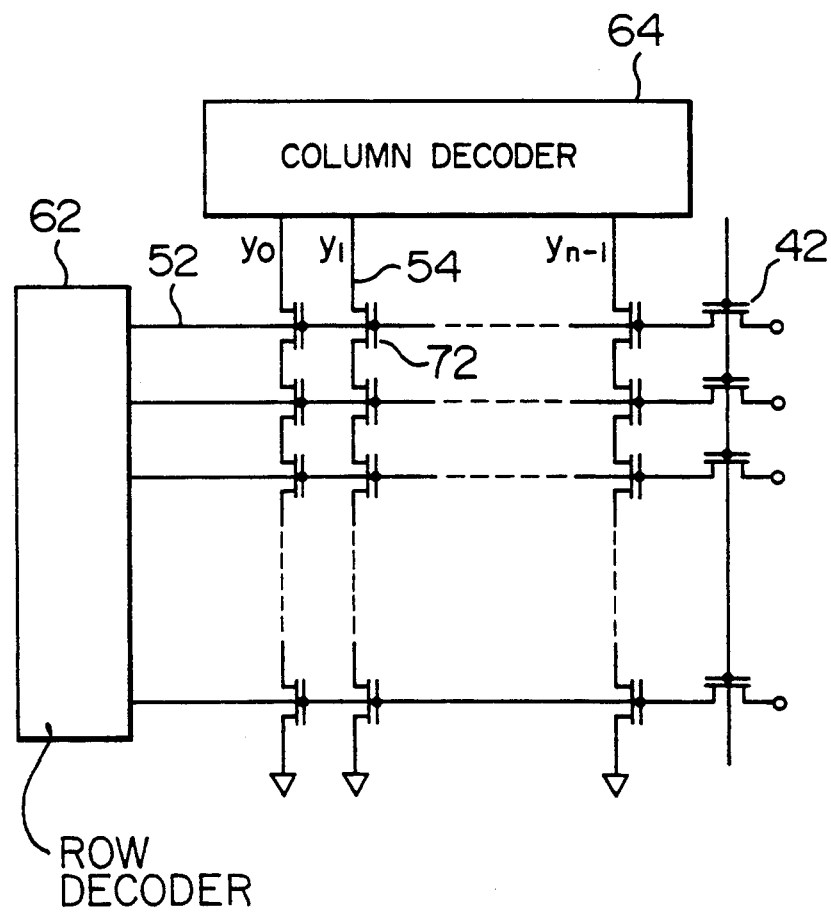
FIG. 3 is a circuit diagram showing a conventional NAND type memory device.
Figure 4:
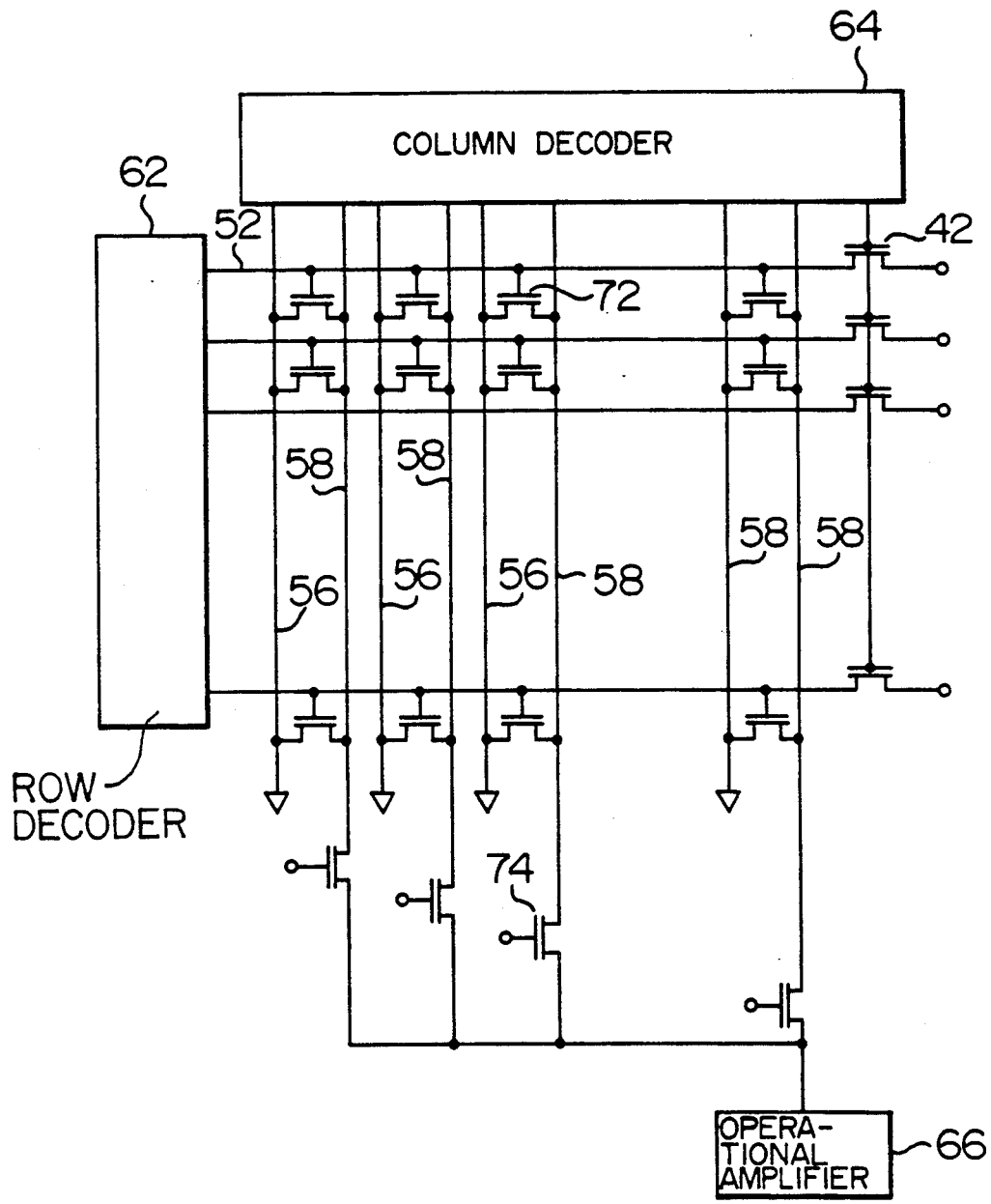
FIG. 4 is a circuit diagram showing a conventional NOR type memory device.

Next, the construction of the memory cell array will be explained with reference to FIGS. 2A to 2C. FIG. 2A is a plan view showing a part of the memory cell array and FIGS. 2B and 2C are cross sectional views taken along lines IIB to IIB and IIC to IIC, respectively. The MOS transistors 8 constituting the memory cell array, the gates 8a, the bit lines (first bit lines 4 and second bit lines 6), the word lines 2 shown in FIG. 1 are disposed as shown in FIGS. 2A to 2C. In FIG. 2A, 1 is a P-type, for example, semiconductor substrate, 20 a gate insulating film and 30 an element isolating film. As shown in the figures, the first and second column lines are disposed alternately in the row direction (horizontal direction in FIG. 1A) and the drains or sources of the MOS transistors disposed on two columns adjacent to each other in the row direction (vertical direction in FIG. 1A) are connected to a common first or second column line so that it is possible to reduce the area required for arranging the whole memory cell array.

The mask ROM of this embodiment is of a NOR type. Therefore, even if the number of cell transistors disposed in the column direction increases, a read current flowing through the bit line will not become small, thereby preventing an access speed from being lowered. Furthermore, a common bit line is connected to the sources or drains of adjacent two cell transistors disposed in the row direction. Therefore, the number of bit lines is reduced to a half of that of a conventional NOR type ROM, thereby reducing the memory cell array area.

In the conventional NOR type ROM, two bit lines must be selected in order to select one memory cell, complicating the circuit structure of the decoder system. In this embodiment, there are provided the Y select lines, each of which selects the first and second select transistors connected to the associated first and second bit lines at the same time. Therefore, by selecting one of the Y select lines, it is possible to select a pair of associated first and second bit lines at the same time, so that the structure of the Y decoder is simplified to the same extent as the conventional NAND type memory device.

As described so far, according to the present invention, the NOR type is used, and two MOS transistors disposed in a row direction at two consecutive columns are connected to a common column line (first or second column line) between the two columns, allowing a high integration. Furthermore, the circuit arrangement is used which allows one column select line to select a pair of associated first and second column lines at the same time. It is therefore possible to provide a semiconductor memory device having a simplified Y decoder structure.

We claim:
1. A MOS memory device comprising:
a memory cell array having memory cells disposed in a matrix of rows and columns, each of said memory cells being formed by a MOS transistor having a gate, a drain and a source, wherein source-drain circuits of the MOS transistors disposed in each row are serially connected with directions thereof alternately reversed;
a plurality of row lines, the gates of said MOS transistors disposed in each row being connected to one of the row lines;
a row decoder connected to said row lines for selecting one of said row lines;
first and second column lines alternately disposed and connected to said MOS transistor such that each of said first column lines is connected to the drains of the MOS transistors disposed in one first column and to the drains of the MOS transistors disposed in another, second column that is adjacent to said one first column, and each of said second column lines is connected to the sources of the MOS transistors disposed in said second column and to the sources of the MOS transistors disposed in a third column which is adjacent to said second column;
data reading means for reading data stored in said memory cell array;
first switching means connected between each of said first column lines and said data reading means;
second switching means connected between each of said second column lines and a ground potential; and
column selecting means for selecting one of the columns of the MOS transistors at a time, said column selecting means including a plurality of column select lines, one provided for each of the columns of the MOS transistors, and a column decoder connected to said plurality of column select lines for selectively activating one of said plurality of column select lines, wherein when any one of said column select lines is activated, said first and second switching means connected to said first and second column lines connected to said MOS transistors in the column corresponding to the activated column select line are made conductive at the same time.

2. A MOS memory device comprising:
a MOS transistor array having MOS transistors disposed in a matrix of rows and columns, drain-source circuits of said MOS transistors in each row being serially connected;
row selecting means for selecting one of rows;
first and second column lines alternately disposed in a direction of the row, each of said first column lines being connected to one end of said drain-source circuit of each of said MOS transistors disposed in one column, and each of said second column lines being connected to the other end of said drain-source circuit of each of said MOS transistors disposed in said one column;
data reading means for reading data stored in said MOS transistor array;
first switching means for selectively connecting one of said first column lines to said data reading means,
second switching means for selectively connecting one of said second column lines to a ground potential; and
column selecting means for selecting one of columns of said MOS transistors, said column selecting means including a plurality of column select lines provided for the columns of the MOS transistors, respectively, wherein when any one of said columns select lines is activated, said first and second switching means connected to said first and second column lines connected to said MOS transistors disposed in the column corresponding to the activated column select line are made conductive at the same time.

3. A MOS memory device comprising:
a memory cell array having memory cells disposed in a matrix of rows and columns, each of said memory cells including a MOS transistor having a gate, a drain and a source, and source-drain circuits of the MOS transistors disposed in each row being serially connected;
a plurality of row lines, each connected to gates of said MOS transistors disposed in each row;
a row decoder connected to said row lines for selecting one of said row lines;
first and second column lines alternately disposed and connected to the MOS transistors such that each of said first column lines is connected to the drains of the MOS transistors disposed in one column and to the drains of the MOS transistors disposed in another one column adjacent to said one column, and each of said second column lines is connected to the sources of the MOS transistors disposed in said adjacent one column and to the sources of the MOS transistors disposed in another adjacent one column which is adjacent to said one adjacent column;

data reading means for reading data stored in said memory cell array;

first switching means connected between each of said first column lines and said data reading means;

second switching means connected between each of said second column lines and a ground potential; and column selecting means for selecting MOS transistors disposed in one of the columns, said column selecting means including a plurality of column select lines, one provided for each of the MOS transistor columns, and a column decoder connected to said plurality of column select lines for selectively activating one of said plurality of column select lines at a time, wherein when any one of said column select lines is activated, said first and second switching means connected to said first and second column lines connected to said MOS transistors disposed in one of the columns associated with said activated column select line are made conductive, while maintaining the other first and second switching means non-conductive.

4. A MOS memory device comprising:

a MOS transistor array having MOS transistors disposed in a matrix of rows and columns, drain-source circuits of said MOS transistors in each row being serially connected;

row selecting means for selecting one of the rows;

first and second column lines alternately disposed in a direction of the row, each of said first column lines being connected to one end of said drain-source circuit of each of said MOS transistors disposed in one column and each of said second column lines being connected to the other end of said drain-source circuit of each of said MOS transistors disposed in said one column;

data reading means for reading data stored in said MOS transistor array;

first switching means connected to each one of said first column lines for selectively connecting said one first column line to said data reading means;

second switching means connected to each of said second column lines for selectively connecting said one second column line to a ground potential; and column selecting means for selecting said MOS transistors disposed in one of the columns, said column selecting means including a plurality of column select lines provided for the columns of the MOS transistors, respectively, wherein when any one of said column select lines is activated, said first and second switching means connected to said first and second column lines connected to said MOS transistors disposed in the column corresponding to the activated column select line are made conductive at the same time, while maintaining the first and second switching means connected to the other first and second column lines non-conductive.

* * * * *